(12) United States Patent
Uskali et al.

(10) Patent No.: US 11,758,680 B2
(45) Date of Patent: Sep. 12, 2023

(54) CABLE ASSEMBLY PROVIDING EXTENDED LED INTERFACE

(71) Applicant: MOTOROLA SOLUTIONS, INC., Chicago, IL (US)

(72) Inventors: Eric R Uskali, Chicago, IL (US); Matthew Zalewski, Buffalo Grove, IL (US); Clark D Fischbach, Woodstock, IL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 73 days.

(21) Appl. No.: 17/457,729

(22) Filed: Dec. 6, 2021

(65) Prior Publication Data

US 2023/0180423 A1 Jun. 8, 2023

(51) Int. Cl.
*G08B 5/36* (2006.01)
*H05K 7/14* (2006.01)
*H05K 1/18* (2006.01)

(52) U.S. Cl.
CPC ............ *H05K 7/1494* (2013.01); *G08B 5/36* (2013.01); *H05K 7/1492* (2013.01); *H05K 1/189* (2013.01); *H05K 2201/10106* (2013.01); *H05K 2201/10189* (2013.01); *H05K 2201/2036* (2013.01)

(58) Field of Classification Search
CPC . G08B 5/36; H05K 1/189; H05K 2201/10106
See application file for complete search history.

(56) References Cited

U.S. PATENT DOCUMENTS

| | | | | |
|---|---|---|---|---|
| 7,049,937 | B1* | 5/2006 | Zweig | H01R 13/641 340/657 |
| 7,294,786 | B2* | 11/2007 | Aldereguia | G02B 6/447 174/84 R |
| 8,033,873 | B2* | 10/2011 | Ankerstjerne | H01R 13/465 379/22.07 |
| 9,083,123 | B2 | 7/2015 | Homan | |
| 9,319,462 | B2* | 4/2016 | Vadivelu | H04L 69/40 |
| 10,641,973 | B2 | 5/2020 | Shenai et al. | |
| 2017/0299791 | A1* | 10/2017 | Hao | G02B 6/447 |

* cited by examiner

*Primary Examiner* — John A Tweel, Jr.
(74) *Attorney, Agent, or Firm* — Barbara R. Doutre; William L. Liu

(57) ABSTRACT

An electronic cable system operates as an extension cable to facilitate external viewing of internal infrastructure LED status. A wired cable is provided having a first end and a second end, the first end including a first I/O coupler, LED detectors and a power jack; and the second end including a second I/O coupler and a plurality of LEDs. The plurality of LEDs of the second end illuminate in response to activation of the LED detector of the first end. The first I/O coupler may plug into an internal module of electronic infrastructure, such as a server, to detect operational status of the internal module via the LED detectors. The second I/O coupler may couple to infrastructure housing, permitting the plurality of LEDs to be viewed externally of the housing. The plurality of external LEDs on the infrastructure housing mimic internal (non-viewable) status indicator LEDs of the internal module.

17 Claims, 8 Drawing Sheets

CABLE ASSEMBLY PROVIDING EXTENDED LED INTERFACE

FIELD OF THE INVENTION

The present invention relates generally to cables and more particularly to an electronic cable assembly that facilitates access to embedded infrastructure control modules.

BACKGROUND

Infrastructure type equipment, such as servers used in communication systems, often include a variety of internal control boxes or infrastructure modules containing third party printed circuit boards with fixed interconnect input/output (I/O) jacks. For information assurance (IA) security reasons, it is desirable that the placement of these control boxes and modules be located deep within the infrastructure housing. However, such placement makes the fixed I/O jacks difficult to access or view from outside of the infrastructure housing. A modular jack of a control module typically includes light emitting diodes (LEDs) which are used to provide operational status identifying if the unit is working properly. While the embedded control module is well protected deep within the infrastructure housing, there is no way for an external user to verify proper operation of the module, as the LEDs are not visible externally to the housing.

Accordingly, there is a need for an interface to facilitate external viewing of internal module operation, where the internal module is embedded within an infrastructure housing.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1A:
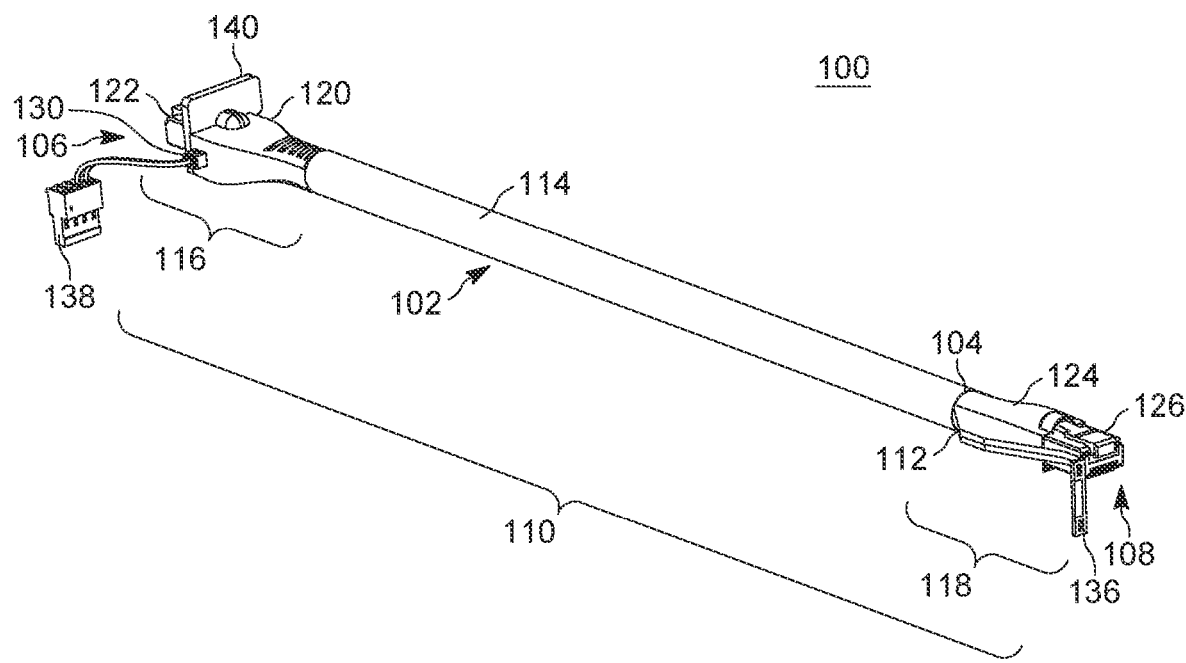
FIG. 1A is a first view of a cable formed in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in a cable assembly which facilitates the ability to view internal light emitting diode (LED) status indicators externally of an infrastructure housing, such as a server housing. Accordingly, the components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

FIG. 1A is a first view of a cable assembly 100 formed in accordance with some embodiments. Cable assembly 100 comprises a wired cable 102 covered by an exterior sheath 114, the cable having a first end 106 and a second end 108 separated along a cable length 110. An interior sheath 104 will be discussed in conjunction with FIG. 1B. The wired cable 102 may include, for example, an Ethernet cable or other cable embedded therein, having I/O couplers 122, 126 at either end of the cable. The embodiments provided herein build upon such an available cable to provide additional circuitry at the first and second ends 106, 108 of the cable. The first end 106 of cable assembly 100 comprises the first I/O coupler 122, LED detector circuitry (shown later) and a power jack 130. The first end 106 of cable assembly 100 may further comprise a power dongle 138 coupled to the power jack 130 to access power from a remote source. The first end 106 of the wired cable 102 may also be referred to as a source end of the cable.

The second end of the cable assembly 100 comprises the second I/O coupler 126 and a plurality of LEDs 136 mounted to an electronic flex 112. Flexible electronics, also known as flex circuits, is a technology for assembling electronic circuits by mounting electronic devices on flexible plastic substrates, such as polyimide, transparent conductive polyester film, and the like. In accordance with the embodiments, the plurality of LEDs 136 of the second end 108 illuminate in response to activation of the LED detector circuitry 134 of the first end 106 (shown in FIG. 1B). The second end of the cable may also be referred to as a transmission end of the cable.

As will be shown later, the cable assembly 100 can advantageously connect to an infrastructure module mounted within an infrastructure housing, so as to detect LED status indicators on the module and mimic them at the second end 108 of the cable at LEDs 136. The second end 108 of the cable assembly 100 is mountable to the infrastructure housing so that the LEDs 136 are viewable externally from the housing.

Figure 1B:
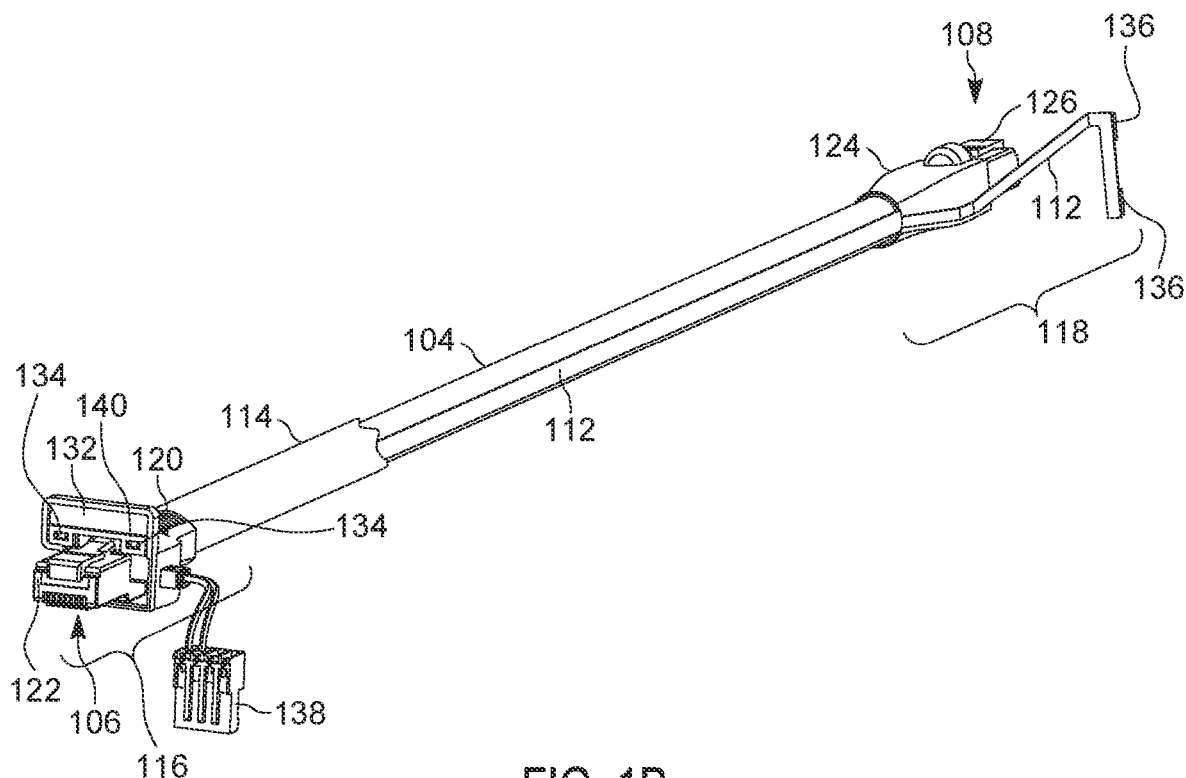
FIG. 1B is a second view of the cable of FIG. 1A with external sheath removed exposing an electronic flex in accordance with some embodiments.

FIG. 1B is a second view of the cable of FIG. 1A with external sheath 114 removed exposing the electronic flex 112 and the first, interior sheath 104 in accordance with some embodiments. The electronic flex 112 runs between the first interior sheath 104 and the second exterior sheath 114 along the cable length 110. The flex 112 extends beyond the sheathed cable at each end so as to provide a substrate surface upon which to dispose electronic components, including power jack 130 and LED detector circuitry 134 at the first end 106 and LEDs and the second end 108.

Referring to FIGS. 1A, 1B, at the first end 106 of cable assembly 100, the electronic flex 112 has a first flex portion 116 having the power jack 130 and the LED detector circuitry 134 disposed thereon. At the second end 108 of cable assembly 100, the electronic flex 112 further provides a second flex portion 118 having the plurality of LEDs 136 disposed thereon.

In accordance with some embodiments, the cable assembly further comprises a first boot 120 for retaining the first I/O coupler 122 at the first end of the cable. The first boot 120 may be formed of a molded, non-conductive elastomeric material. In accordance with some embodiments, the first boot 120 may further retain the first flex portion 116 so as to provide access to the power jack 130 and LED detector 134 disposed upon the first flex portion. A gasket 140 may be coupled to the first flex portion 116 to provide isolation between the LED detectors 134 disposed on the flex 112 and extraneous light sources.

The cable assembly further comprises a second boot 124 for retaining the second I/O coupler 126 at the second end 108 of the cable. The second flex portion 118 with LEDs 136 mounted thereon protrudes externally from the first and second sheaths 104, 114, and runs externally to the second boot 124 at the second end 108 of the cable.

Figure 1C:
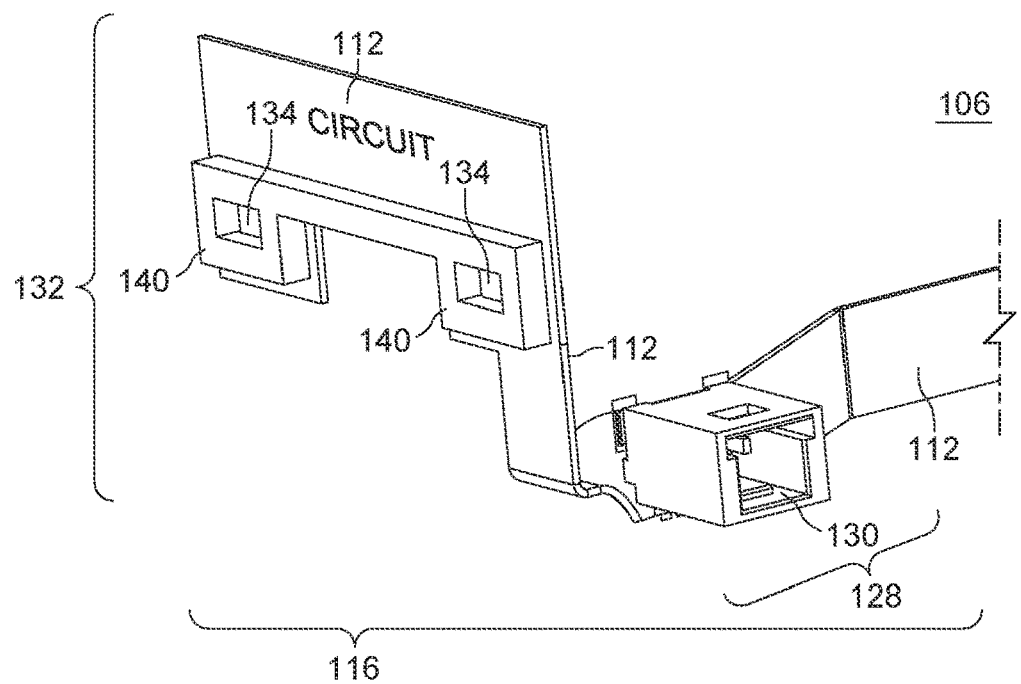
FIG. 1C is a close-up view of a first flex portion of the electronic flex at a first end of the cable formed in accordance with some embodiments.

FIG. 1C is a close-up view of the first flex portion 116 of the electronic flex 112 of the first end 106 of the cable formed in accordance with some embodiments. The first flex portion 116 may be bent into sections to provide optimum access to the elements disposed thereon. For example, the first flex portion 116 may comprise a first flex section 128 having the power jack 130 disposed thereon; and a second flex section 132 having logic circuitry and LED detector circuitry 134 disposed thereon. The gasket 140 may be, for example, an anti-reflection gasket coupled to the first flex portion 116, at second flex section 132, to provide isolation between the LED detectors 134. The gasket 140 may contain opening within which to seat the detectors 134. The gasket 140 prevents cross-talk between the detectors 134 as well as detection errors from extraneous light sources, thereby ensuring that only the aligned sensor detects light from a corresponding infrastructure module LED (shown later).

Figure 1D:
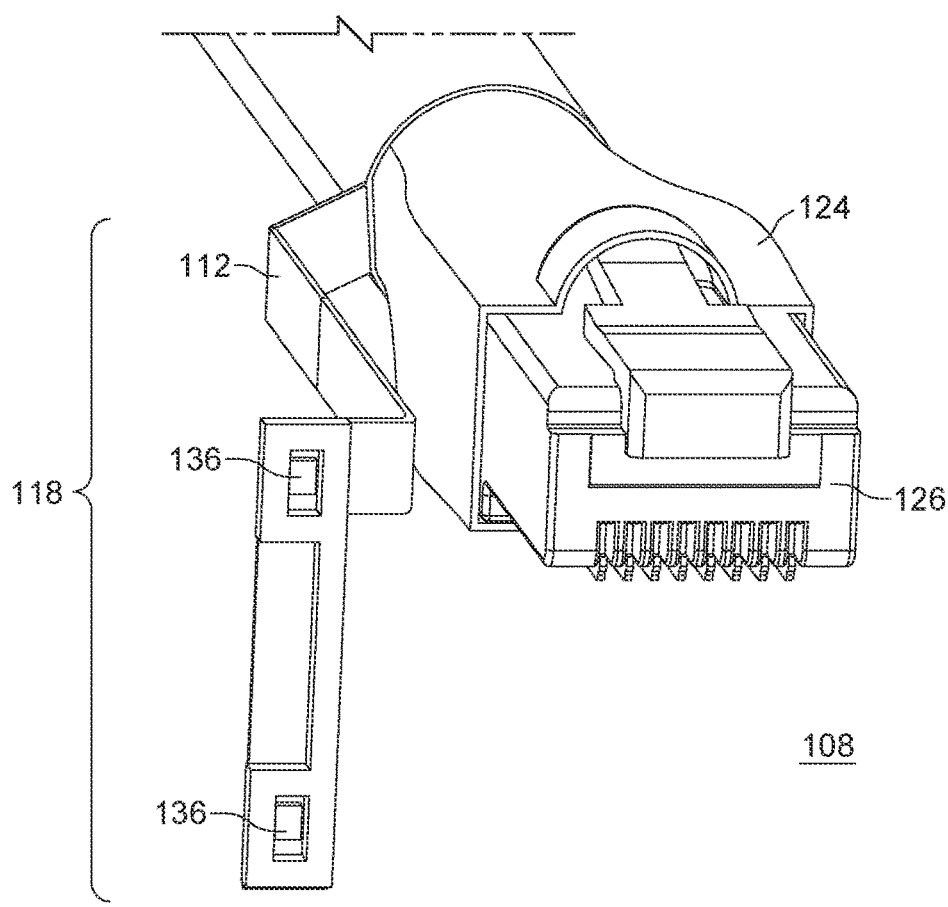
FIG. 1D is a close-up view of a second flex portion of the electronic flex located at a second end of the cable formed in accordance with some embodiments.

FIG. 1D is a close-up view of the second flex portion 118 of the electronic flex 112 located at a second end 108 of the cable formed in accordance with some embodiments. The second flex portion 118 of flex 112 includes LEDs 136 mounted thereon. The second flex portion 118 with LEDs 136 mounted thereon protrudes externally from the internal and external sheaths 104, 114, and runs externally to the second boot 124 at the second end 108 of the cable. This view also shows the second boot 124 retaining the second I/O coupler 126 at the second end 108 of the cable. The second boot 124 may be formed of a non-conductive elastomeric material, and shaped to retain the second I/O coupler 126 at the second end 108 of the cable.

In an alternative embodiment, the second flex portion 118 of flex 112 may include accessible wire traces with contacts for mating with LEDs of an unused modular jack of infrastructure housing, such as a server housing.

Figure 2A:
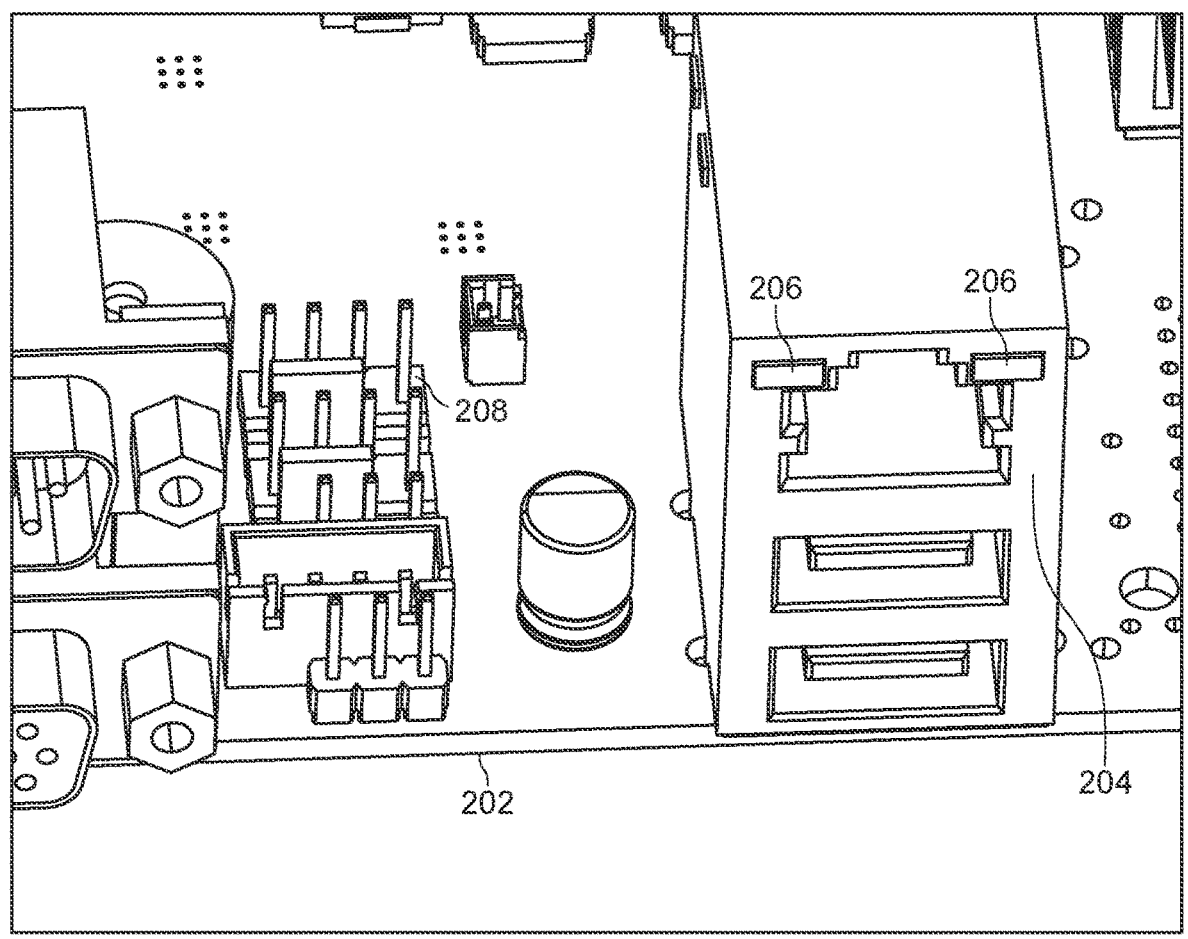
FIG. 2A is a printed circuit board (PCB) of an infrastructure module for receiving the cable formed in accordance with some embodiments.

FIG. 2A is a printed circuit board (PCB) 202 of an infrastructure module for receiving the wired cable 102 formed in accordance with some embodiments. The printed circuit board 202 may, for example, be part of a module mounted within an infrastructure housing, such as a server housing. The pcb 202 includes a modular I/O jack 204 with status indicator LEDs 206 coupled thereon, the status indicator LEDs 206 providing operational status of the module. For example, the indicators may indicate module on (green LED on), module link active (green blinking LED), and module off (red LED) functions. The pcb 202 includes an on-board power source 208, such as available from a USB header or other power source on the pcb 202.

Figure 2B:
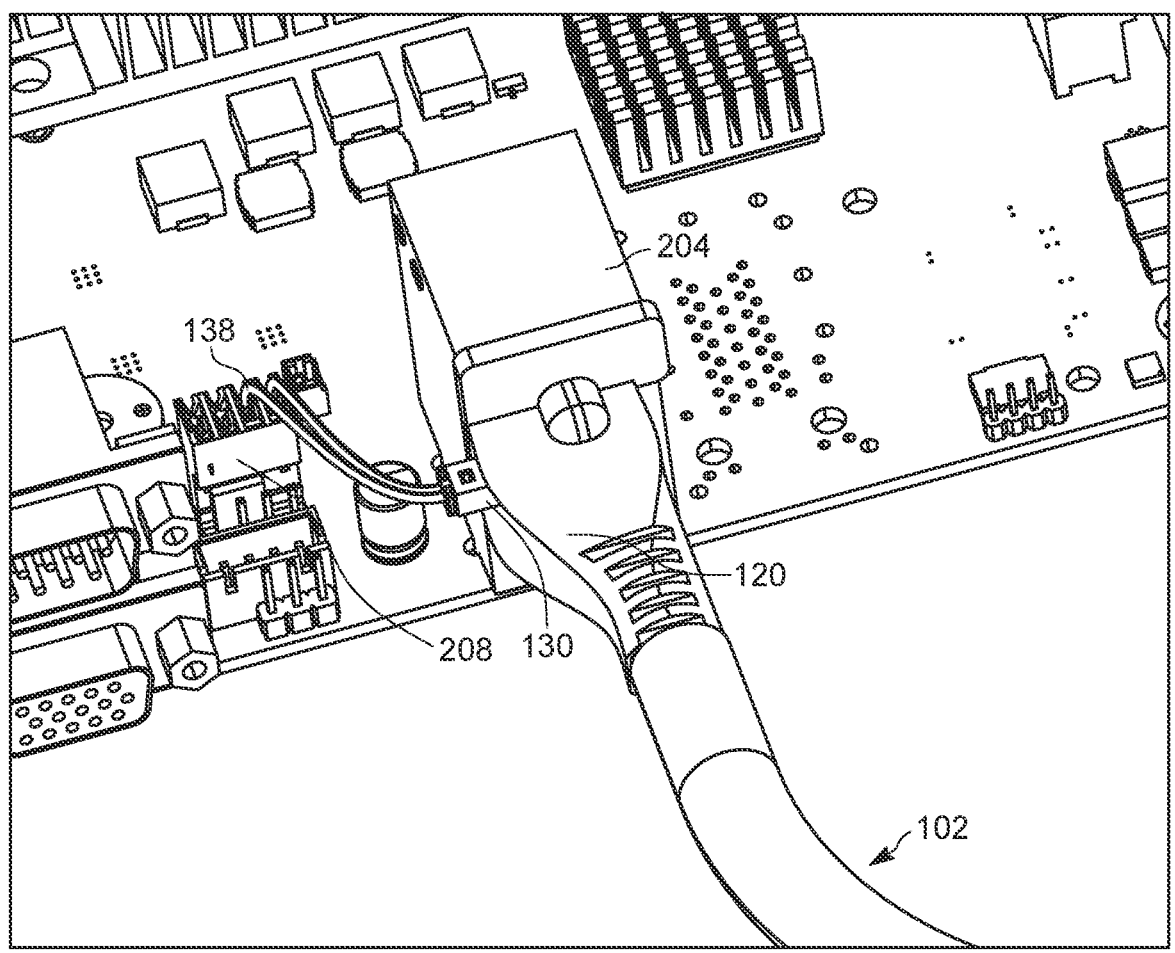
FIG. 2B shows the first end of the cable coupled to a modular jack of the PCB in accordance with some embodiments.

FIG. 2B shows the first end (source end) of the cable assembly 100 plugged into the modular jack 204 of the pcb 202 in accordance with some embodiments. The first I/O coupler 122 and flex sections 128, 132 of first flex portion 116 are retained within the first boot 120. The first I/O coupler 122 is plugged into the modular jack 204. The status indicator LEDs 206 of the modular jack 204 (shown in FIG. 1A) are now aligned with the photo-detector components, LED detectors 134, of the second flex section 132. The power jack 130 protrudes through the first boot 120 (the power jack 130 being coupled internally to the first flex section 128. The power lanyard or power dongle 138 couples the power jack 130 to the pcb power source 208.

Figure 2C:
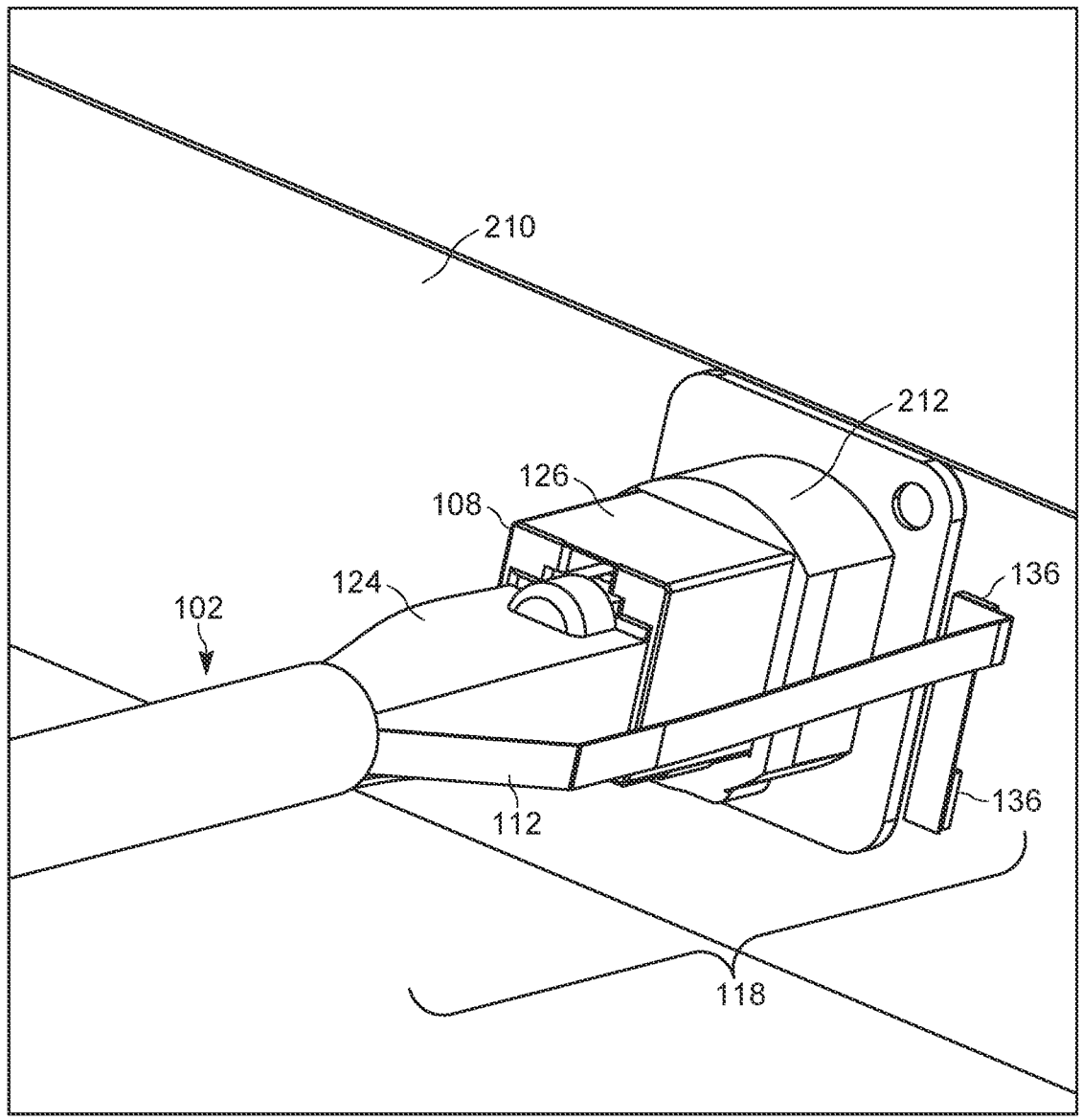
FIG. 2C shows the second end of the cable coupled to a modular jack of an infrastructure housing wall in accordance with some embodiments.

FIG. 2C shows the second end 108 of the cable assembly 100 coupled to a modular jack 212 of an infrastructure housing wall 210 in accordance with some embodiments. The second end 108 of wired cable 102 having I/O coupler 126 plugs into the modular I/O jack 212. The second flex portion 118 of electronic flex 112 protrudes from the double sheath 104, 114 and externally bypasses the second boot 124 with retains second I/O coupler 126, so as to mount to a wall 210 of the server housing. The wall 210 of server housing can have cutouts formed therein to accommodate the LEDs 136, so that the LEDs 136 are viewable externally from the server housing.

Hence, the first I/O coupler 122 of the first end of the wired cable plugs into an internal modular jack of a server housing, the internal modular jack having LEDs. The LED detectors 134 of the wired cable detect light from the status indicator LEDs 206 of the internal modular jack 204, the LED detectors thereby controlling the lighting of the LEDs 136 at the second flex portion 118 of the wired cable.

In an alternative embodiment, the modular jack 212 may also comprise LEDs and the flex 112 may include accessible wire traces with contacts for mating with LEDs of the modular jack 212. This can be beneficial in cases, for example, where a server has accessible unused connectors with LEDs which are viewable externally from the server housing.

Figure 2D:
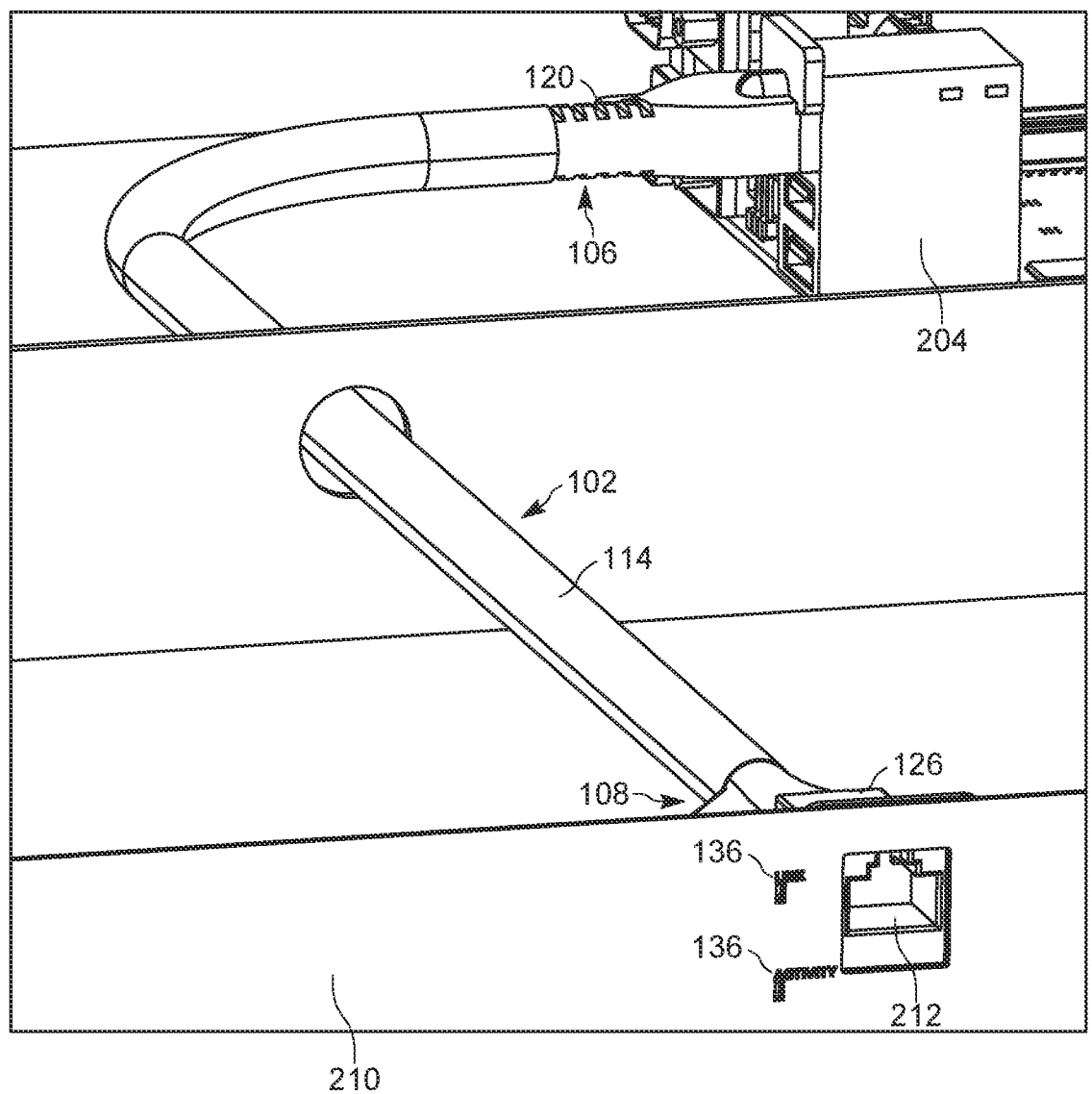
FIG. 2D shows the end to end wired cable as part of an electronic cable system for the infrastructure housing in accordance with some embodiments.

FIG. 2D shows the end to end wired cable 102 as part of an electronic cable system for the infrastructure housing 210 in accordance with some embodiments. The first end 106 of the wired cable 102 is plugged into the modular jack 204 of the internal infrastructure module. The second end 108 of the wired cable 102 is coupled to the modular jack 212 of the infrastructure housing wall 210 allowing the LEDs 136 to mount into openings within the exterior infrastructure housing wall. The LEDs 136 of the wired cable are thus exposed and viewable exteriorly of the infrastructure housing wall 210. Activation of the status indicator LEDs 206 (shown in FIG. 2A) of the embedded modular jack 204 are detected by the LED detectors located within first boot 120 at the first end of the wired cable. The detected status indicator signals are transferred via the electronic flex 212 to the LEDs 136, viewable externally of the infrastructure housing. Thus, the internally embedded infrastructure module status is mimicked externally of the infrastructure housing 210.

Figure 2E:
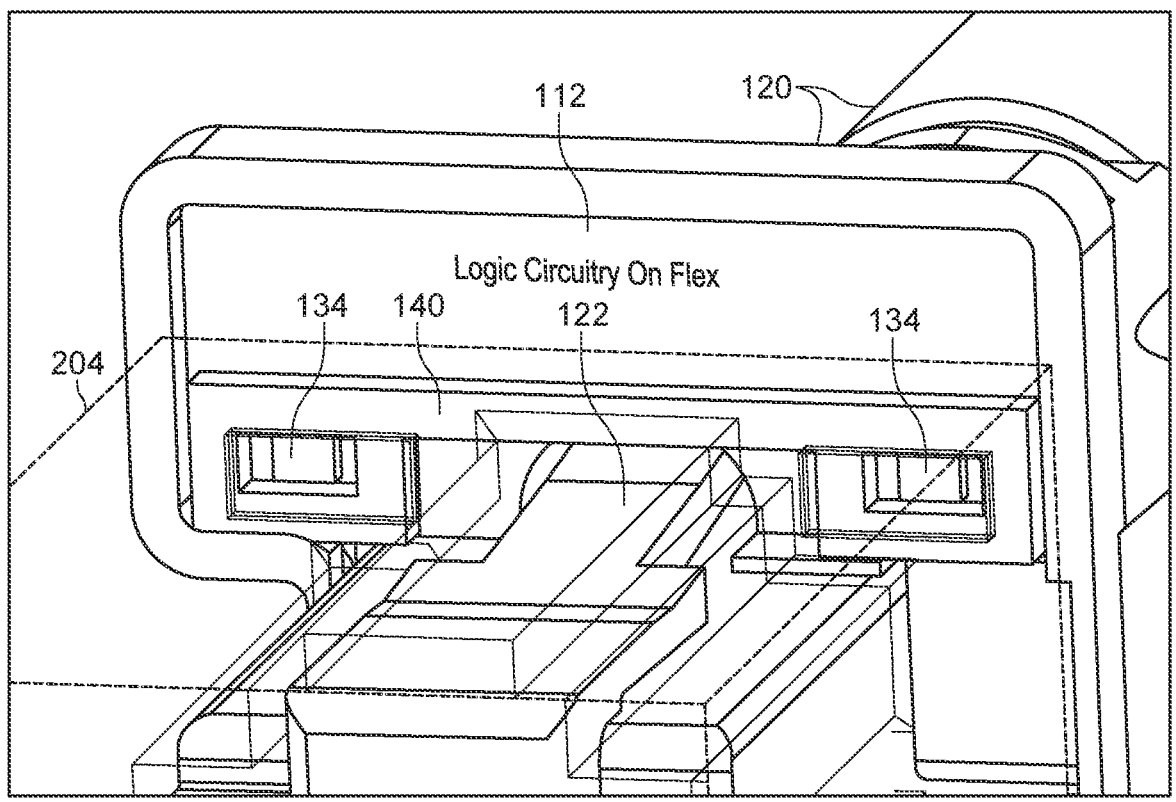
FIG. 2E is a front view of the first end of the cable formed in accordance with some embodiments.

FIG. 2E is a front view of the first end of the wired cable 102 formed in accordance with some embodiments. This view shows an interface between the first end of the cable and the modular jack 204 (shown in dashed lines). As seen in this view, the logic circuitry and LED detectors 134 are disposed on flex 112, and flex 112 is retained within first boot 120. The first I/O coupler 122 is plugged into the modular jack 204. This view further shows the gasket 140 coupled to the flex 112, the gasket isolating the LED detectors 134. The LED detectors 134 align with LEDs (not shown). of the modular jack 204 (referring to the status indicator LEDs 206 shown in FIG. 2A).

Figure 3:
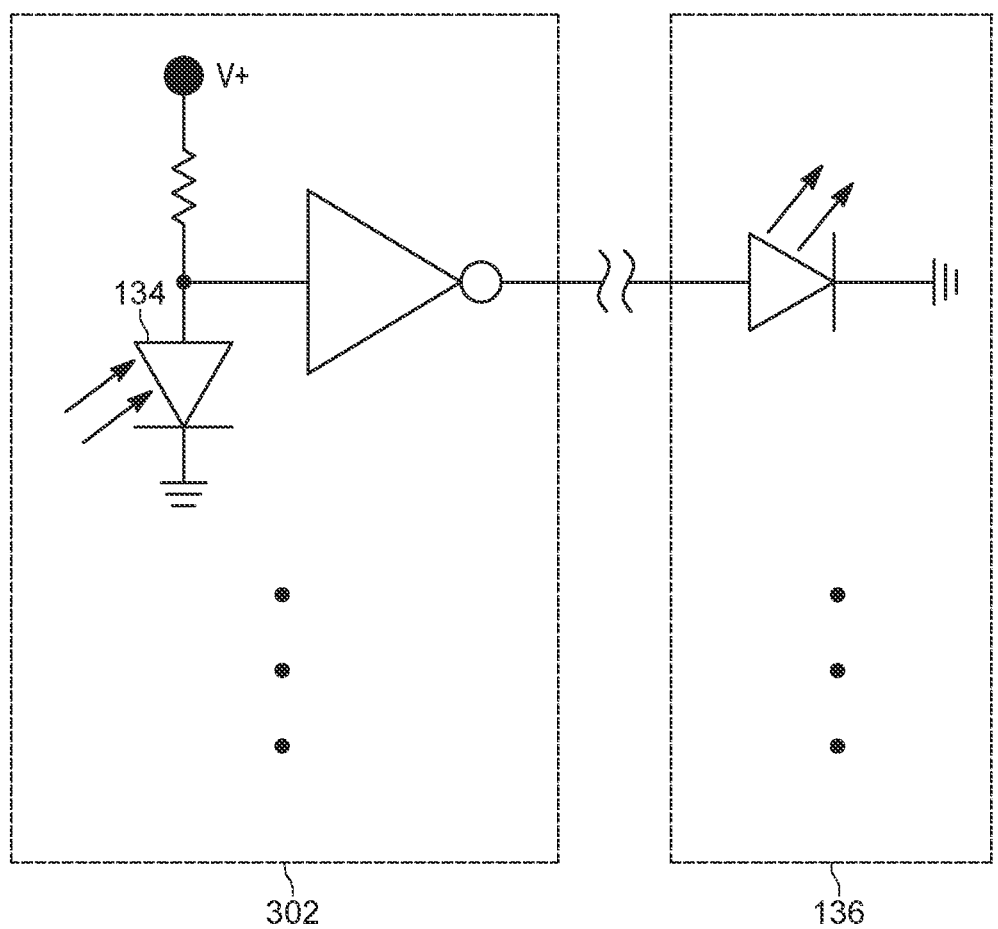
FIG. 3 is a block diagram of circuitry for LED detection incorporated into the cable in accordance with some embodiments.

FIG. 3 is a block diagram 300 of circuitry for LED detection incorporated into the cable assembly in accordance with some embodiments. Detector circuit 302 includes photo-detectors 134, power, and logic circuits. The detector circuit 302 is located on flex 112 at the first end of the cable. The detector circuit 302 detects light from status indicator LED 206 (shown previously in FIG. 2A) of the infrastructure module proximately located thereto. The detected signals picked up at the first end of the cable are then transferred via the flex and used to mimic the status indicator activity at the LEDs 136 located at the second end of the cable. Again, the LEDs 136 of flex 112 can be viewed through holes cut in the infrastructure housing. Thus, the status indicators of the embedded infrastructure module are now readily viewable externally of the infrastructure at LEDs 136. The operational status of the cable system may indicate, for example module on, module link active, and module off functions. For example, a green light may represent the module on function, a red light may indicate the module off function, and a green blinking light may indicate an active module link.

As described previously, in an alternative embodiment, accessible wire traces of flex 112 may provide contacts for coupling to LEDs of an unused connector of infrastructure housing, such as a server housing.

Accordingly, there has been provided a cable assembly which facilitates the ability to view the operational status of an internal infrastructure module exteriorly of an infrastructure housing containing the module.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. An electronic cable assembly, comprising:
    a wired cable having a first end and a second end, the first end comprising a first I/O coupler, a light emitting diode (LED) detector circuit and a power jack;
    the second end comprising a second I/O coupler and a plurality of light emitting diodes (LEDs), the plurality of LEDs of the second end illuminating in response to activation of the LED detector circuit of the first end; and
    a flex circuit running between the first end and the second end of the wired cable, the flex circuit having a first flex portion having the power jack and the LED detector circuit disposed thereon at the first end of the wired cable, the flex circuit having a second flex portion having the plurality of LEDs disposed thereon at the second end of the wired cable, and the plurality of LEDs being mounted to the flex circuit.

2. The cable assembly of claim 1, wherein the wired cable is coupled at the first end to an internal module of a server housing having a status indicator LEDs mounted thereon, and the wired cable is coupled at the second end to the server housing to provide external viewing of the plurality of LEDs of the second end of the wired cable in response to activation of the status indicator LEDs of the internal module and activation of the LED detector circuit at the first end of the wired cable.

3. A cable assembly comprising:
    a wired cable having a first end and a second end, the first end comprising a first I/O coupler, a light emitting diode (LED) detector and a power jack;
    the second end comprising a second I/O coupler and a plurality of light emitting diodes, the plurality of LEDs of the second end illuminating in response to activation of the LED detector of the first end;
    an electronic flex running between the first end and the second end of the wired cable, the electronic flex having a first flex portion having the power jack and the LED detector disposed thereon at the first end of the wired cable, and the electronic flex having a second flex portion having the plurality of LEDs disposed thereon at the second end of the wired cable;
    a first boot retaining the first I/O coupler at the first end of the wired cable, the first boot further retaining the first flex portion and providing access to the power jack and LED detector disposed upon the first flex portion; and
    a second boot retaining the second I/O coupler at the second end of the wired cable, and wherein the second flex portion, having the LEDs mounted thereon protrudes externally along the second boot at the second end of the wired cable.

4. An electronic cable system, comprising:
    a wired cable covered by a first sheath, the wired cable having a first end and a second end separated along a cable length;
    an electronic flex running along an exterior surface of first sheath and covered by a second sheath along the cable length, the electronic flex protruding externally of the first and second sheaths to provide a first flex portion at the first end of the electronic cable system and a second flex portion at the second end of the electronic cable system;

a first boot retaining a first I/O coupler at the first end of the wired cable;
a second boot retaining a second I/O coupler at the second end of the wired cable;
the first flex portion extending into the first boot, the first flex portion comprising:
a first flex section having a power jack disposed thereon; and
a second flex section having logic circuitry and light emitting diode (LED) detectors disposed thereon; and
the second flex portion protruding externally of the first and second sheaths and the second boot at the second end of the wired cable, the second flex portion having LED contacts mounted thereon.

5. The electronic cable system of claim 4, further comprising:
a power dongle coupled to the power jack.

6. The electronic cable system of claim 4, further comprising:
a gasket coupled to the first flex portion and providing isolation between the LED detectors.

7. The electronic cable system of claim 4, wherein the power jack partially protrudes from a side of the first boot.

8. The electronic cable system of claim 4, wherein the first boot is formed of non-conductive elastomeric material.

9. The electronic cable system of claim 4, wherein the LED contacts of the second flex portion have LEDs mounted thereon.

10. The electronic cable system of claim 9, wherein the first end of the electronic cable system is coupled to a server module having status indicator LEDs located within a server housing, and the second end of the electronic cable system is coupled to an exterior wall of the server housing to expose the LEDs of the wired cable, the status indicator LEDs within the server housing being detected by the LED detectors of the wired cable, and a status indicator signal being transferred over the electronic flex to the LEDs of the second end of the wired cable to provide corresponding status indicators externally of the server housing.

11. The electronic cable system of claim 9, wherein the first I/O coupler of the first end of the wired cable plugs into an internal modular jack of a server housing, the internal modular jack having status indicator LEDs mounted thereon, and the LED detectors of the wired cable detect light from the status indicator LEDs of the internal modular jack, the LED detectors thereby controlling the lighting of the LEDs at the second flex portion of the wired cable.

12. The electronic cable system of claim 4, wherein the LED contacts of the second flex portion couple to LEDs of an unused connector of a server housing.

13. An electronic cable system for a server, comprising:
a server housing having a plurality of internal modules, at least one internal module having status indicator light emitting diodes (LEDs) which are not visible exteriorly of the server housing;
the electronic cable system coupled to the internal module, the electronic cable system comprising:
a wired cable covered by a first sheath, the wired cable having a first end and a second end separated along a cable length;
an electronic flex running along an exterior surface of first sheath and covered by a second sheath along the cable length, the electronic flex protruding externally of the first and second sheaths to provide a first flex portion at the first end of the electronic cable system and a second flex portion at the second end of the electronic cable system;
a first boot retaining a first I/O coupler at the first end of the wired cable;
a second boot retaining a second I/O coupler at the second end of the wired cable;
the first flex portion extending into the first boot, the first flex portion comprising:
a first flex section having a power jack disposed thereon; and
a second flex section having logic circuitry and LED detectors disposed thereon; and
the second flex portion protruding externally from the first and second sheaths and from the second boot at the second end of the wired cable, the second flex portion having LEDs mounted thereon.

14. The electronic cable system for the server of claim 13, wherein holes are cut in the server housing to accommodate the LEDs mounted to the second flex portion for exterior viewing of operational status of the at least one internal module.

15. The electronic cable system for the server of claim 13, further comprising:
a power dongle coupled to the power jack, the power dongle accessing a power coupler within the server for activating the LED detectors.

16. The electronic cable system for the server of claim 13, further comprising:
a gasket coupled to the first flex portion to provide isolation between the LED detectors.

17. The electronic cable system for the server of claim 13, wherein the LED detector detects light from status indicator LEDs of a modular jack of the at least one internal module.

* * * * *